Sept. 29, 1964 H. G. RUDENBERG ETAL 3,150,999

RADIANT ENERGY TRANSDUCER

Filed Feb. 17, 1961

INVENTORS
HERMANN G. RUDENBERG
BRIAN DALE by Ezekiel Wolf, Wolf & Greenfield
Attorneys United States Patent Office 3,150,999
Patented Sept. 29, 1964

3,150,999

RADIANT ENERGY TRANSDUCER

Hermann Gunther Rudenberg, Beverly, and Brian Dale, Peabody, Mass., assignors to Transitron Electronic Corporation, Wakefield, Mass.

Filed Feb. 17, 1961, Ser. No. 90,116
5 Claims. (Cl. 136—89)

The present invention relates in general to devices for converting radiant energy to an electrical current and more particularly concerns a novel solar cell which is relatively easy to fabricate and characterized by exceptionally high efficiency.

It is known that light energy for conversion to electrical energy by a semiconductor solar cell is lost due to reflections from the cell surface. If the solar cell is coated with a thin non-reflecting transparent layer, this loss is reduced. However, there are a number of disadvantages. First, producing the thin layer requires careful control techniques since the layer must be of the order of a half wavelength at the center frequency of the visible spectrum. Second, the bandwidth for perfect reflection is relatively small since the thickness of the layer deviates from being a half wavelength at frequencies at the edge of the visible spectrum. In addition, the thin layer is subject to being scratched and may not be stable at extreme ranges of temperatures. Moreover, if film is applied by evaporation techniques, the required heat may also affect the electrical characteristics of the semiconducting rectifying junction so that the latter properties may not be controlled independently of the process for applying the coating.

The present invention has as an important object the provision of a radiant energy transducer for converting radiant energy, such as light and heat, into electrical energy with great efficiency by minimizing energy loss due to reflections from the surface.

It is still another object of the invention to provide a photoelectric semiconductor device in accordance with the preceding object in which fabrication is relatively simple and permits independent control of the semiconductor device electrical characteristics.

A further object is to provide high emissivity in the far infrared region of the energy spectrum to provide for cool operation of such cells in a radiative envorinment.

According to the invention, the device comprises a block of radiant energy responsive material having intersecting surfaces which form an acute angle so that energy rays reflected from one surface impinges upon at least another. When the device comprises a semiconductor transducer, the number of current carriers which flow across a rectifying junction immediately below the surface is a function of the total radiant energy intensity upon the surfaces. Consequently, a load connected across the junction receives a current which increases as the radiant energy intensity becomes greater.

In a preferred embodiment of the invention, the semiconductor surface is formed with a number of adjacent tetrahedrons. In a preferred method of making the device, a block of semiconductor material is placed in contact with a die resembling a waffle iron and having adjacent tetrahedronal protrusions having converging facets. The die and block are subjected to ultrasonic vibrations to form mating pockets in the block of semiconductor material. The block with the pockets thus formed is then processed in accordance with conventional diffusion techniques to establish a rectifying junction very close to the faces of the adjacent tetrahedrons.

The desired surface may also be formed by etching facets, such as by using a germanium 100 "superoxol" etch on the 111 crystal plane.

Other features, objects and advantages of the invention will become apparent from the following specification when read in connection with the accompanying drawing in which.

Figure 1:
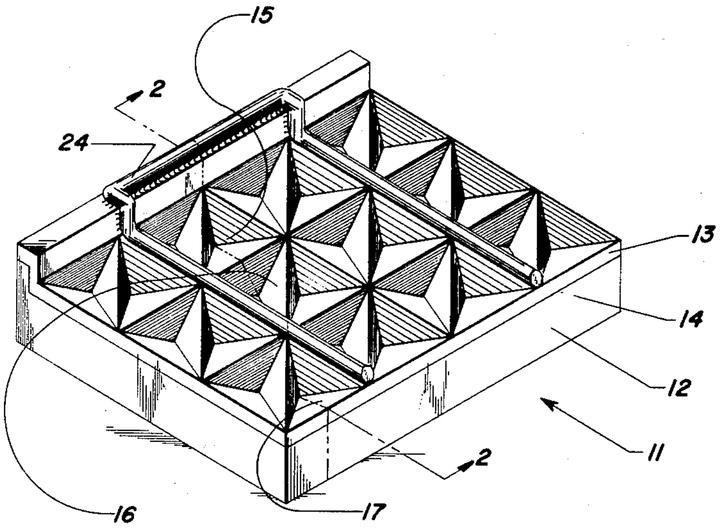
FIG. 1 shows a perspective view of one of the novel devices.

With reference now to the drawing and more particularly FIG. 1 thereof, there is illustrated a perspective view of a device according to the invention. The device comprises a block 11 of semiconductor material, such as silicon, having a region 12 of one conductivity separated by a rectifying junction 14 from a region 13 of opposite conductivity. The block 11 is formed with pyramidal pockets like 15–17, a section 2—2 of these pockets being shown in FIG. 2.

Figure 2:
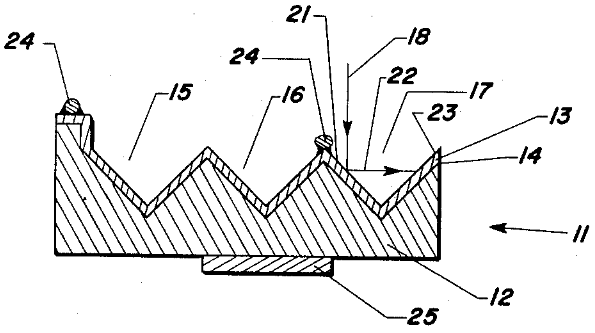
FIG. 2 is a sectional view through section 2—2 of FIG. 1 to illustrate the location of the rectifying junctions.

Referring to FIG. 2, there is shown the path of an incident light ray 18 directed toward surface 21 of pocket 17 to show how the energy reflected from the surface 21 follows the path of ray 22 to the surface 23 so that reflected energy may also be utilized to release electrical carriers in the layer 13 which may cross the junction 14 into the layer 12 and thereby cause a current to flow across the junction proportional to the light intensity which current may be utilized by an external circuit.

In order to avoid obscuring the principles of the invention, the electrodes for connection to an external circuit are not shown in FIG. 1. Only two such electrodes are shown in FIG. 2. One 24 is shown in contact with the surface layer 13. The other 25 is shown in conductive contact with the lower layer 12. It is preferred that the upper surface electrodes 24 be of relatively small area so as not to appreciably interfere with the effective surface area capable of receiving light energy. To reduce resistance, it is preferred that the conductive connections to the upper surface be connected in parallel by appropriate means, such as shown in the application Serial No. 855,605 of H. Gunther Rudenberg entitled Photoelectric Device, filed November 27, 1959, now Patent No. 3,112,230.

While structures according to the invention may be formed by cutting individual planar slices of semiconductor material and arranging these slices to form pyramides, a preferred method of making the device comprises the following steps. A block of semiconductor material of a first conductivity type, such as P-type silicon is placed in contact with a die whose shape inversely conforms to that of the surface shown in FIG. 1. This die is then placed in contact with the block and ultrasonic techniques used to impress the shape of the die to the surface of the silicon block. The formed surface is then placed in contact with material having N-type dopant and the dopant is diffused into the shaped surface to establish a rectifying junction 14 very close to the upper surface.

The ideal efficiency of this type of cell is increased by approximately 50% over the theoretically ideal efficiency of a plane clear cell and a comparison of measured efficiency of the novel structure to a plane clear cell of the same effective area shows a measured increase of 33%.

The ideal efficiency of a plane clear cell of reflection coefficient R is reduced by the factor $$K_1=(1-R)$$

by the reflection of incident energy. The ideal efficiency of a structure of two intersecting surfaces is reduced only by a factor $$K_2=(1-R^2)$$

and of the pyramidal structure having three surfaces on each pyramid, affording incident light three reflections before leaving the cell, is $$K_3=(1-R^3)$$

The table illustrates the improvement obtainable for a range of R calculated, being the ratio $K_2/K_1$ or $K_3/K_1$.

| R | (Plane cell) $K_1$ | $K_2$ | (Tetrahedron) $K_3$ | Improvement $K_2/K_1$ | Calculated $K_3/K$ |
|---|---|---|---|---|---|
| 0.10 | 0.90 | 0.99 | 0.999 | 1.10 | 1.11 |
| 0.20 | 0.80 | 0.96 | 0.992 | 1.20 | 1.24 |
| 0.30 | 0.70 | 0.91 | 0.973 | 1.30 | 1.39 |
| 0.40 | 0.60 | 0.84 | 0.936 | 1.40 | 1.56 |
| 0.50 | 0.50 | 0.75 | 0.875 | 1.50 | 1.75 |

Silicon has $R=0.35–0.40$ providing a 1.5 times or 50% calculated improvement with three-faceted cells.

There has been described a photoelectric device capable of minimizing reflected energy normally wasted to increase the efficiency of converting light energy to electric energy. The device is relatively easy to fabricate without interfering with control of electrical characteristics of the semiconducting rectifying junction. In addition, the device is rugged with its electrical and mechanical characterstics being substantially the same as those of a planar clear cell.

While the structure described above functions well when made with semiconductors such as silicon, germanium and selenium, the principles of the invention are applicable to photoconducting devices comprising gold-doped germanium, lead sulfide, cadmium sulfide, and other materials having photoconductive properties. The principles are also applicable to devices made of thermoelectric material where the incident radiant energy is heat.

It is evident that those skilled in the art may now make numerous modifications of and departures from the specific embodiments and techniques described herein without departing from the inventive concepts. Consequently, the invention is to be construed as limited only by the spirit and scope of the appended claims.

What is claimed is:

1. A radiant energy transducer comprising, means defining a surface responsive to radiant energy impinging upon said surface for converting at least some of said radiant energy into an electrical current, said surface being formed with pyramid-shaped depressions each defined by three areas so that radiant energy incident along the axis of a depression upon one of said areas is directed to both others of said areas to increase the conversion efficiency of said transducer.

2. A radiant energy transducer in accordance with claim 1 wherein said means comprises a semiconductor rectifying junction generally parallel and closely adjacent to said surface having a photocurrent which is related to the light intensity impinging upon said surface.

3. A photoelectric semiconductor device in accordance with claim 2 wherein said rectifying junction separates a P-type silicon body from an N-type surface.

4. A photoelectric semiconductor device in accordance with claim 2 wherein said rectifying junction separates an N-type silicon body from a P-type surface layer.

5. A photoelectric semiconductor device in accordance with claim 2 and further comprising low resistance metallic connections at the ridges formed by adjacent areas of adjacent depressions, a terminal, and means for connecting said connections to said terminal in parallel to provide a low series resistance between said terminal and said surface.

References Cited in the file of this patent

UNITED STATES PATENTS

| | | |
|---|---|---|
| 2,904,612 | Regnier | Sept. 15, 1959 |
| 2,915,578 | Pensak | Dec. 1, 1959 |
| 2,919,298 | Regnier et al. | Dec. 29, 1959 |
| 3,015,590 | Fuller | Jan. 5, 1962 |

FOREIGN PATENTS

| | | |
|---|---|---|
| 560,652 | Great Britain | Apr. 13, 1944 |
| 536,616 | Canada | Jan. 29, 1957 |